United States Patent
Dries et al.

(10) Patent No.: US 6,229,152 B1
(45) Date of Patent: May 8, 2001

(54) STRAIN COMPENSATED INDIUM GALIUM ARSENIDE QUANTUM WELL PHOTOCONDUCTORS WITH HIGH INDIUM CONTENT EXTENDED WAVELENGTH OPERATION

(75) Inventors: John C. Dries; Stephen R. Forrest; Milind Gokhale, all of Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 0 days.

(21) Appl. No.: 09/252,494

(22) Filed: Feb. 18, 1999

(51) Int. Cl.$^7$ ................... H01L 31/072; H01L 31/109; H01L 31/0328; H01L 31/0336
(52) U.S. Cl. ................... 257/17; 257/18; 257/21; 257/184; 257/185; 438/93; 438/94
(58) Field of Search ................ 257/21, 17, 18, 257/19, 184, 185, 186; 438/93, 94

(56) References Cited

U.S. PATENT DOCUMENTS

| | | | |
|---|---|---|---|
| 5,471,068 | * 11/1995 | Tsusi et al. | 257/21 |
| 5,521,935 | * 5/1996 | Irikawa | 372/45 |
| 5,825,796 | * 10/1998 | Jewell et al. | 372/45 |
| 5,880,491 | * 3/1999 | Soref et al. | 257/190 |
| 5,929,462 | * 7/1999 | Kasukawa et al. | 257/18 |

FOREIGN PATENT DOCUMENTS

363098158 * 4/1988 (JP) .

OTHER PUBLICATIONS

Gershoni, et al., "Strained–layer $Ga_{1-x}In_xAs/InP$ Avalanche Photodetectors", Appl. Phys. Lett. 53, 1294–1296, (1988).

* cited by examiner

Primary Examiner—William Mintel
(74) Attorney, Agent, or Firm—Wolff & Samson

(57) ABSTRACT

The use of highly compressively strained $In_{1-x}Ga_xAs$ quantum wells having a high In content for the detection of light to a wavelength of $\lambda \approx 2.1$ $\mu m$ is disclosed. Crystal quality is maintained through strain compensation using tensile strained barriers of InGaAs, InGaP, or InGaAsP. High efficiencies have been achieved in detectors fabricated using this technique. The theoretical cutoff wavelength limit for diodes fabricated using this technique is calculated to be $\lambda \sim 2.1$ $\mu m$. Lattice mismatched layers may be used to transition between compressively strained layers and tensile strained layers to prevent the crystal from breaking up. Multiple quantum wells are formed with multiple periods of strained InGaAs, transition layers and tensile strained layers. These detectors have application in semiconductor, amplifiers, detectors, optical switches, images, etc.

18 Claims, 7 Drawing Sheets

Y PERIODS

STRAIN COMPENSATED INDIUM GALIUM ARSENIDE QUANTUM WELL PHOTOCONDUCTORS WITH HIGH INDIUM CONTENT EXTENDED WAVELENGTH OPERATION

GOVERNMENT RIGHTS

The present invention has been made under a contract with DARPA and the State of New Jersey, and the government may have certain rights to the subject invention.

BACKGROUND OF THE INVENTION

1. Field of the Invention

The present invention is directed to a method for extending the cutoff wavelength of Indium Galium Arsenide (InGaAs) primarily for spectroscopy and night vision applications by increasing the In content by the use of highly strained InGaAs. Highly strained InGaAs quantum wells are created by balancing compressive strain with tensile strain. A lattice matched intermediate layer can be used to transition from a compressive strained layer to a tensile strained layer. The present invention also relates to a semiconductor device having a strain compensated banier region.

2. Related Art

The paper by Dries, et al., STRAIN COMPENSATED $In_{1-x}Ga_xAs$ (x<0.47) ARSENIDE QUANTUM WELL PHOTODIODES FOR EXTENDED WAVELENGTH OPERATION, published in Applied Physics Letters, Volume 73, p. 2263, the entire disclosure of which is incorporated herein by reference, discusses experiments forming p-i-n PHOTODIODES using a strain compensated multiple quantum well absorption region. These detectors exhibit high quantum efficiencies (QE), low dark currents, and are potentially useful in night vision and spectroscopic applications as well as any other suitable applications.

Present technologies for the extension of InGaAs into the $\lambda=2$ $\mu$m wavelength band utilize buffer layers of lattice-mismatched InAsP which produce laterally threading misfit dislocations. This threading mechanism reduces the effect of lattice-mismatch on subsequent epitaxial layers. The InGaAs detectors fabricated using this technique can have responses to a wavelength of 2.5 $\mu$m, but suffer from large dark currents due to residual defects in the epitaxial layers.

Applications for night vision, remote sensing and spectroscopy have increased interest in the 1.65 $\mu$m to 2 $\mu$m wavelength band. New detectors and detector materials with access to this range of wavelengths are particularly desirable due to the limited utility of HgCdTe, InAs, InSb, and strain-relaxed InGaAs based devices. HgCdTe is plagued by material growth issues and the narrow bandgaps of InAs and InSb result in detectors with large dark currents at room temperature. Furthermore, GaInAsSb devices grown on GaSb substrates have dark currents in the microamp range for detectors as small as 100 $\mu$m in diameter. Lattice-mismatched InGaAs, when grown on buffer layers of relaxed InAsP, results in detectors with acceptable dark currents and high bandwidth. However, residual defects in the epitaxial layers, as well as the lack of integration capability with InP electronics, highlight the need for novel materials and detectors for use at wavelengths $\lambda>1.65$ $\mu$m.

In order to increase the cuttoff wavelength, it is necessary to increase the In content. The thickness of the absorption region is limited by critical thickness considerations, and thus quantum wells are formed. This is deleterious to the prospect of extending the absorption region to longer wavelengths, for the quantum confinement produces a blue shift from the bulk band edge. The cutoff wavelength is reduced to a lesser extent by strain in the InGaAs, for compressively strained InGaAs has a larger bandgap than relaxed InGaAs. Previously, the use of strained InGaAs for detection at $\lambda \leq 2$ $\mu$m has been demonstrated in separate absorption, multiplication layer avalanche photodiodes (D. Gershoni, H. Temkin, and M. B. Panish, Appl. Phys. Lett. 53, 1294–1296, (1988)), but critical layer thickness considerations limited these devices to 10 quantum wells (QW), resulting in low quantum efficiencies. The present invention offsets the compressive strain in the QW by an equal and opposite strain in the barrier region surrounding the QW. Such strain-compensation techniques, in principle, permit the growth of an unlimited number of strained quantum wells, thus dramatically improving device quantum efficiency.

The additional degree of freedom for bandgap engineering afforded by strained layer materials has been used to advantage in achieving high performance lasers, detectors, and modulators. The present invention uses strain-compensated InGaAs grown on InP substrates in very low dark current multiple quantum well (MQW) p-i-n diodes for efficient detection of light to wavelengths as long as $\lambda=2.1$ $\mu$m.

OBJECTS AND SUMMARY OF THE INVENTION

It is an object of the invention is to provide a method which enables the use of highly strained InGaAs by balancing compressive strain with tensile strain.

It is another object of the present invention to provide a strain compensated multiple quantum well absorption region having a high In content.

Still another object of the invention is to increase the ability to detect optical radiation using InP based materials for wavelengths beyond the traditional cutoff wavelength of 1.65 $\mu$m.

A further object of the invention is the provision of a strain compensated broadband photodetector with responsivity to approximately 2.1 $\mu$m.

Even another object of the invention is to provide a method that balances the strain of compressive InGaAs on InP by subsequently depositing an equally strained tensile layer of InGaAs, InGaP, or InGaAsP.

A still further object and advantage of the invention is the provision of an optical detector such as a photoconductor or photodiode, a superlattice avalanche photodiode (APD), a bulk InP APD or a bulk InAlAs APD incorporating a strain-compensated multiple quantum well absorbing region.

An additional object of the present invention is to provide a strain compensated device having lattice matched transition layers between compressively strained layers and tensile strained layers.

An additional object of the present invention is the provision of a photodiode that increases the efficiency and ultimately the gain of avalanche photodiodes.

Even an additional object of the invention is to provide a photodiode that at proper wavelengths avoids saturation over a wide dynamic range.

Still even an additional object of the present invention is the ability to use highly strained InGaAs in various applications, including, but not limited to amplifiers, detectors, optical switches, imagers, etc.

Yet an additional object of the present invention is to provide an amplifier device with a "self-correcting" feature which avoids saturation over a wide dynamic range.

The use of highly compressively strained $In_{1-x}Ga_xAs$ quantum wells having a high In content for the detection of light to a wavelength of $\lambda \approx 2.1$ μm is disclosed. Crystal quality is maintained through strain compensation using tensile strained barriers of InGaAs, InGaP, or InGaAsP. High efficiencies have been achieved in detectors fabricated using this technique. The theoretical cutoff wavelength limit for diodes fabricated using this technique is calculated to be $\lambda \sim 2.1$ μm. Lattice-matched layers may be used to transition between compressively strained layers and tensile strained layers to prevent the crystal from breaking up. Multiple quantum wells are formed with multiple periods of strained InGaAs, transition layers and tensile stained layers. These detectors have application in amplifiers, detectors, optical switches, images, etc.

BRIEF DESCRIPTION OF THE DRAWINGS

Other important objects and features of the invention will be apparent from the following Detailed Description of the Invention taken in connection with the accompanying drawings in which.

DETAILED DESCRIPTION OF THE INVENTION

The present invention relates to the use of highly compressively strained $In_{1-x}Ga_xAs$ quantum wells having high In content for the detection of light to a wavelength of $\lambda \approx 2.1$ μm. The present invention includes a new technique for fabricating high quantum efficiency InGaAs p-i-n photodiodes with responsivity beyond the lattice-matched 1.65 μm wavelength using a strain compensated multiple quantum well absorption region. Detectors fabricated using 50 period MQWs exhibit a single pass quantum efficiency of 30% and dark currents of 250 pA at 20V. These detectors are potentially useful in night vision applications as well as spectroscopy. Calculations reveal that the upper limit for cutoff wavelength extension using this technique is $\lambda \approx 2.15$ μm.

Figure 1:
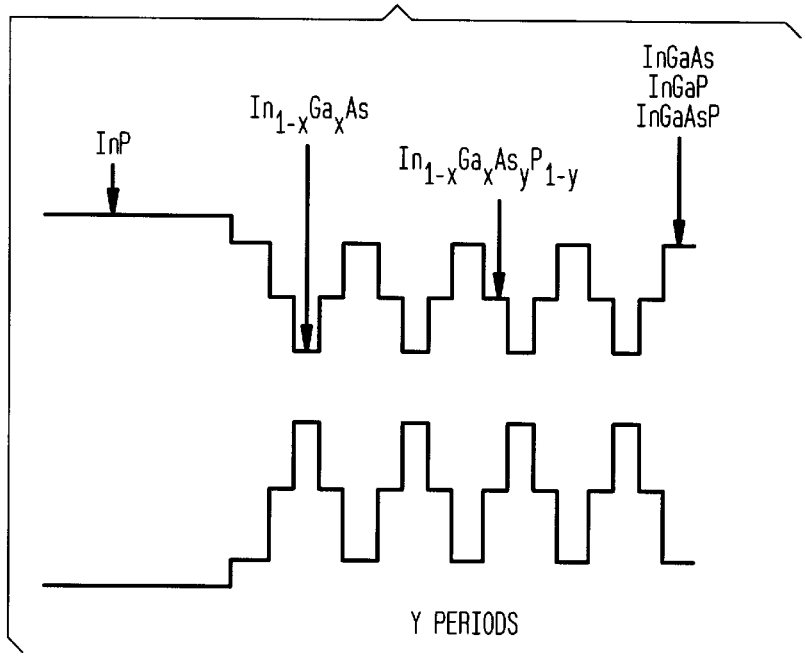
FIG. 1 is a schematic view of a photodetector of the present invention.

Referring to FIG. 1, a schematic view of an absorption region according to the present invention is shown. The device is formed on an InP substrate. Compressively strained $In_{1-x}Ga_xAs$ is deposited on the InP and thereafter tensile strained InGaAs, InGaP or InGaAsP can be applied to compensate for the compressively strained $In_{1-x}Ga_xAs$. This can be repeated for y periods. It is desirable to add an intermediate or "speed-up" layer between the compressive and tensile strained layers for carrier extraction and to prevent the crystal from breaking up. Any $In_{1-x}Ga_xAs_yP_{1-y}$ composition lattice matched to InP can be used as such a transition layer. For the $In_{1-x}Ga_xAs$, if x is less than 0.47 the material is in compression but if x is greater than 0.47 the material is in tension. Increasing the Indium content, i.e. decreasing x, results in a compressively strained material that extends the cutoff wavelength. The device shown in FIG. 1 includes four layers per period, but this could be decreased to two layers or increased to more than four layers if desired.

Figure 2A:
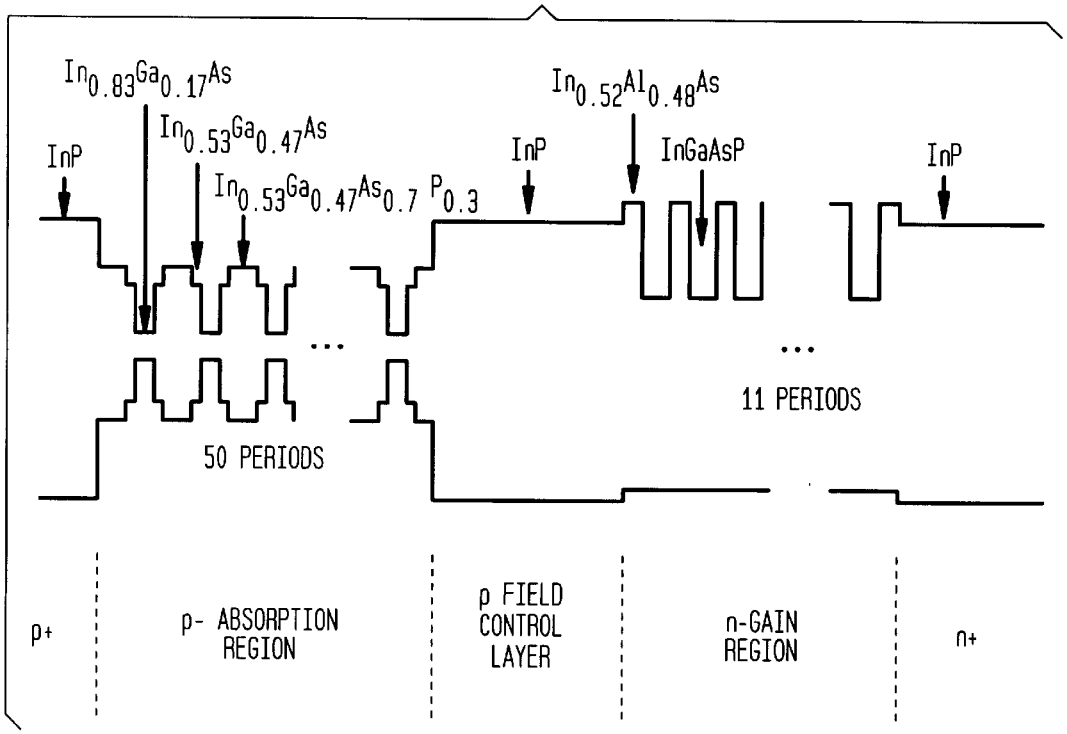
FIG. 2a is a schematic view of an embodiment of an InGaAs avalanche photodiode having a MQW absorption region according to the present invention.

FIG. 2a is a schematic view of an embodiment of an InGaAs avalanche photodiode according to the present invention. This figure shows a 50 period $In_{0.83}Ga_{0.17}As$ multiple quantum well. The $In_{0.83}Ga_{0.17}As$ material is highly compressively strained, and to compensate for the strain, tensile strained layers are applied thereto. The tensile strained layer comprises $In_{0.53}Ga_{0.47}AS_{0.7}P_{0.3}$. Lattice matched speed-up layers of $In_{0.53}Ga_{0.47}As$ are added between the compressively strained layers and the tensile strained layers to prevent dislocations at the highly strained interface.

This device extends the wavelength response of traditional Separate Absorption Multiplication Avalanche Photodiodes (SAM-APDs) by incorporating a strain-compensated multiple quantum well absorbing region. Furthermore, the noise performance of the device is improved by altering the ratio of the impact ionization coefficients α (electrons) and β (holes) using an InAlAs/InGaAsP superlattice gain region. The composition of the quaternary InGaAsP is chosen such that the balance band offset at the InGaAsP/InAlAs heterojunction is negligible and the difference in bandgap energies is accommodated solely in the conduction band. Thus, electrons are the primary impact ionizing carrier. As a result, the strain compensated absorption region is lightly p doped in order for electrons to be the primary injected carrier.

For such a device, it is desirable for growth to take place on p+ (Zn) doped InP substrates. A buffer layer of Be doped InP may be grown followed by the multiple quantum well absorption region. This region consists of three materials. $In_{1-x}Ga_xAs$ wells are formed between lattice matched barriers. The compressive strain of the $In_{0.83}Ga_{0.47}As$ is balanced by a tensile strained quaternary alloy of $In_{0.53}Ga_{0.47}AS_{0.70}P_{0.30}$. This narrow bandgap (<1.0 eV) material is used in order to prevent hole trapping in the absorption region for high quantum efficiency operation. Additionally, the use of the lattice matched ternary $In_{0.53}Ga_{0.47}As$ as the barrier material maximizes the cutoff wavelength of the device, by lowering the conduction subband to hole subband transition energy. Next, a p type field control layer is grown in order to separate the high field avalanche region from the low field, drift region of the device. Finally, an InAlAs/InGaAsP superlattice is grown for the gain region. It could comprise of 11 periods of 115 Å InAlAs barriers and 115 Å InGaAsP wells that are tuned such that the balance band offset at the heterojunction is nearly zero. This superlattice results in enhanced electron impact ionization, resulting in lower noise avalanche photodiodes.

Figure 2B:
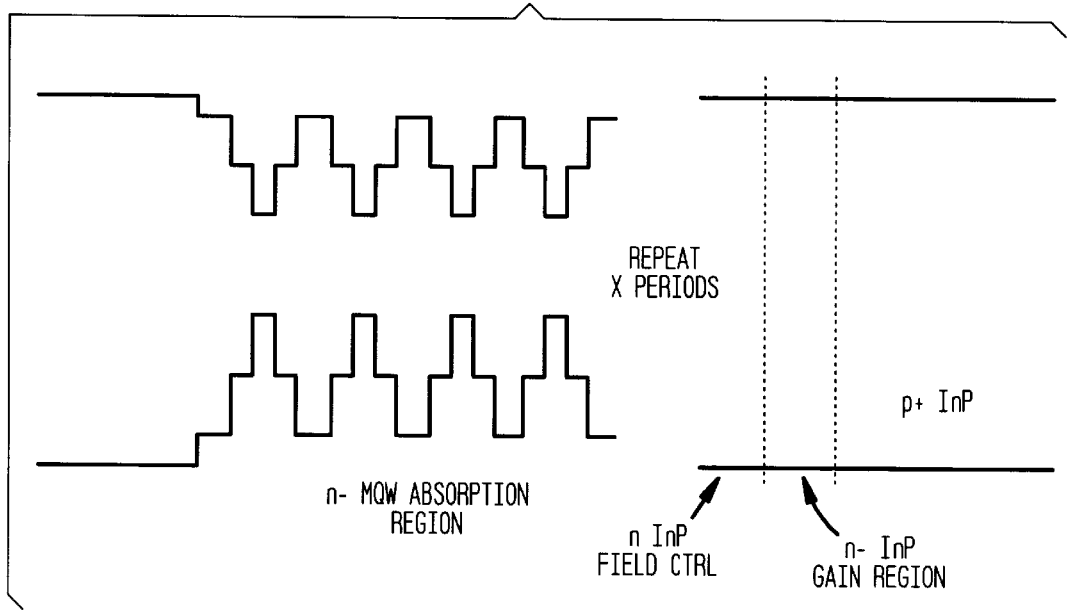
FIG. 2b is a schematic view of a bulk InP avalanche photodiode having a MQW absorption region according to the present invention.
Figure 2C:
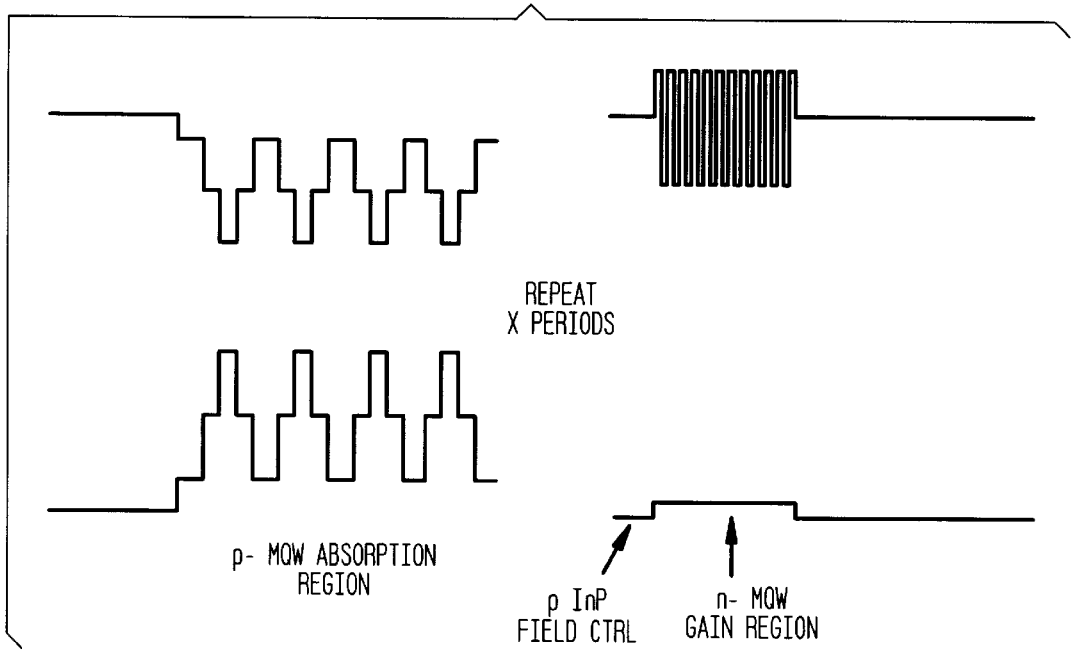
FIG. 2c is a schematic view of a superlattice avalanche photodiode having a MQW absorption region and a n–MQW gain region.
Figure 2D:
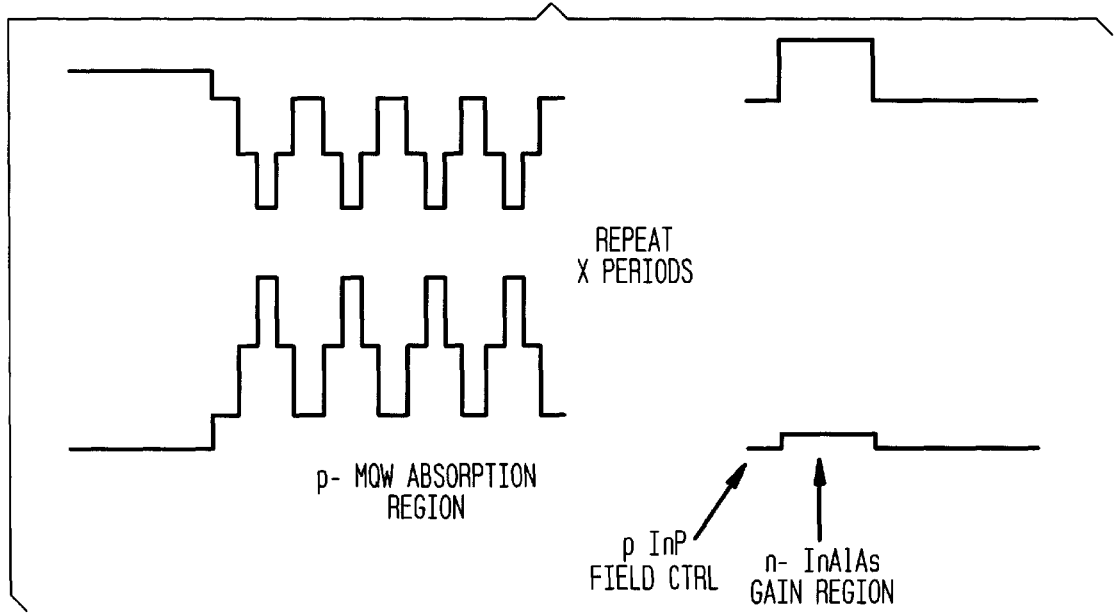
FIG. 2d is a schematic view of a bulk InAlAs avalanche photodiode according to the present invention.

FIGS. 2b, 2c and 2d are schematic views of bulk InP, superlattice and bulk InAlAs avalanche photodiodes, respectively, according to the present invention. The device of FIG. 2b utilizes an n– InP gain region, while the device of FIG. 2c utilizes an n– MQW gain region. On compressively strained layers, tensile strained layers are added to compensate for the strain. Again, intermediate, lattice matched layers may be used for carrier extraction to prevent the crystal from breaking up. As illustrated, the strain compensated MQW absorption region of the present invention can be used with any known detector device.

Figure 3:
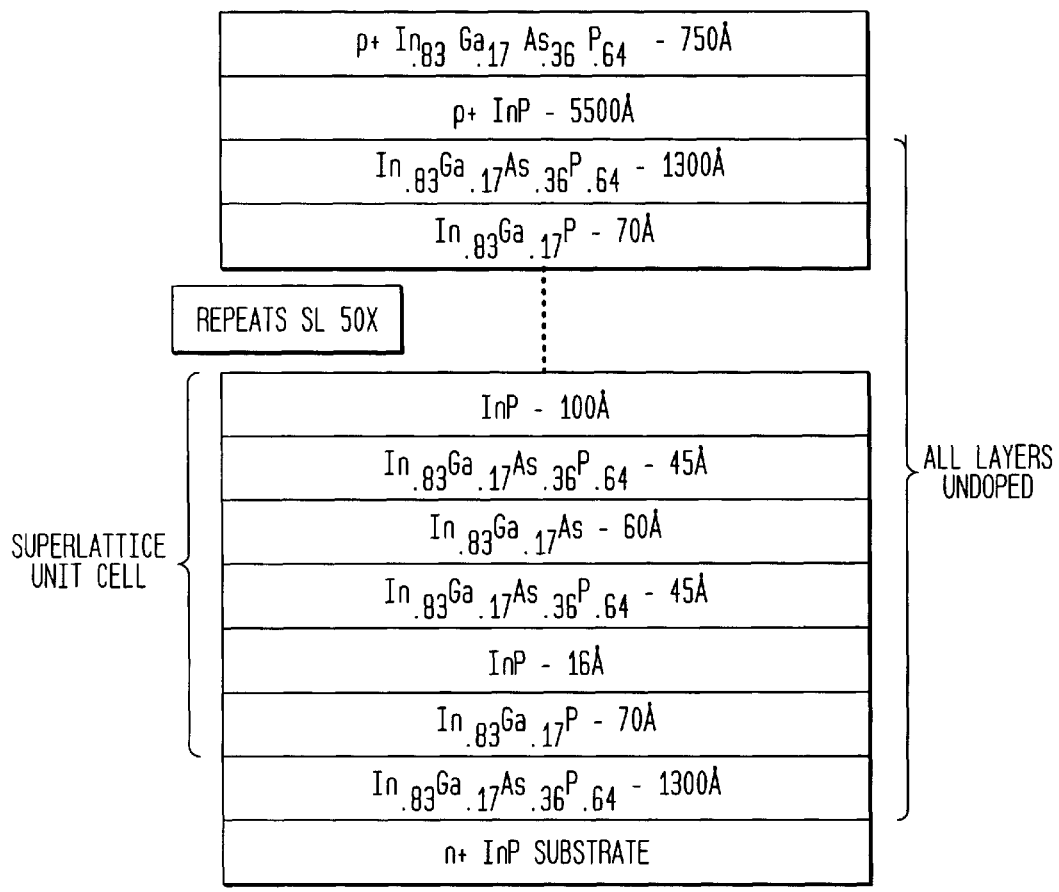
FIG. 3 is a diagrammatic view of another embodiment of a multiple quantum well photodiode of the present invention.

FIG. 3 is a diagram of another embodiment of a superlattice avalanche photodiode according to the present invention, with epitaxial layer structure grown by gas-source molecular beam epitaxy. Composition and thickness values shown are determined by double crystal x-ray diffraction and subsequent modeling of the spectra. The first structure investigated consisted of alternating wells of compressively strained $In_{0.83}Ga_{0.17}As$ used in combination with tensile strained $In_{0.83}Ga_{0.17}P$ barriers. As previously observed in InAsP/InGaP quantum well lasers, the abrupt change in the group V species during growth resulted in poor interface quality as evidenced by rough surface morphology and broad superlattice x-ray peaks of ~180 arcsecs full width at half maximum (FWHM). A second structure eliminated undesirable group V interdiffusion by gradually changing the group V species at the termination of the growth of each layer and produced superlattice peaks with <38 arcsecs FWHM. That is, growth proceeded in a series of four compositional steps from $In_{0.83}Ga_{0.17}P$ to InP to $In_{0.83}Ga_{0.47}As_{0.36}P_{0.64}$ to $In_{0.83}Ga_{0.17}As$ as shown in FIG. 3. Three separate samples were grown with 60 Å, 80 Å, and 100 Å thick $In_{0.83}Ga_{0.47}As$ quantum wells. The layer thickness of the +1.2% tensile strained $In_{0.83}Ga_{0.17}P$ was chosen to nearly compensate the strain induced from the –2.0% compressively strained $In_{0.83}Ga_{0.17}As$.

Figure 4A:
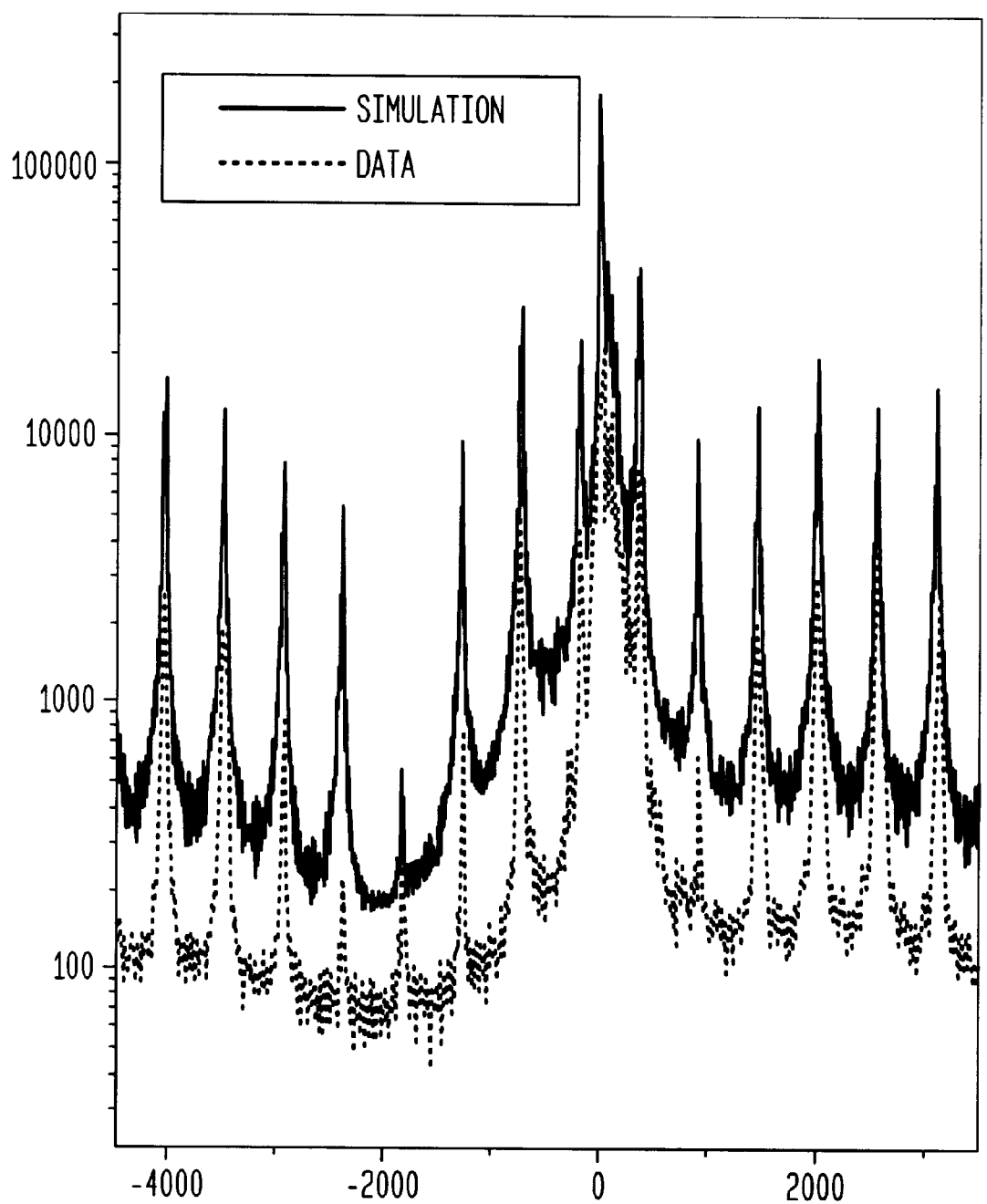
FIG. 4a is a display of double-crystal x-ray diffraction data.
Figure 4B:
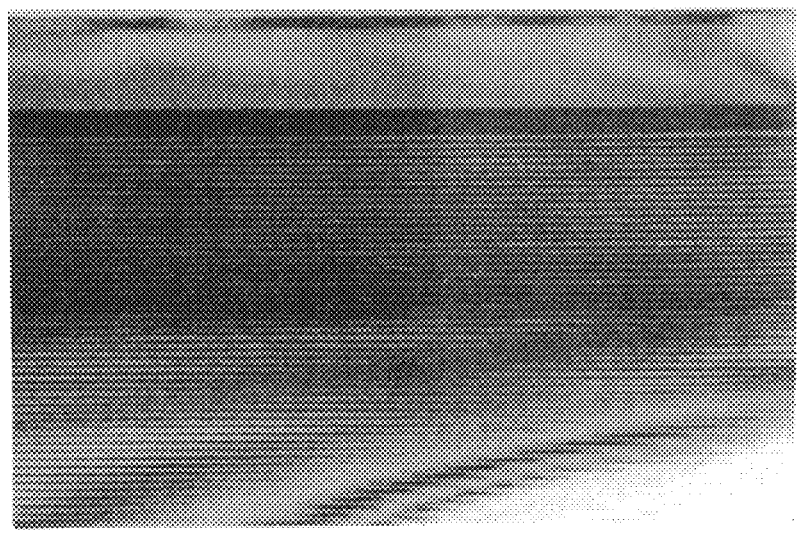
FIG. 4b is a cross-sectional transmission electron microscope image.
Figure 4C:
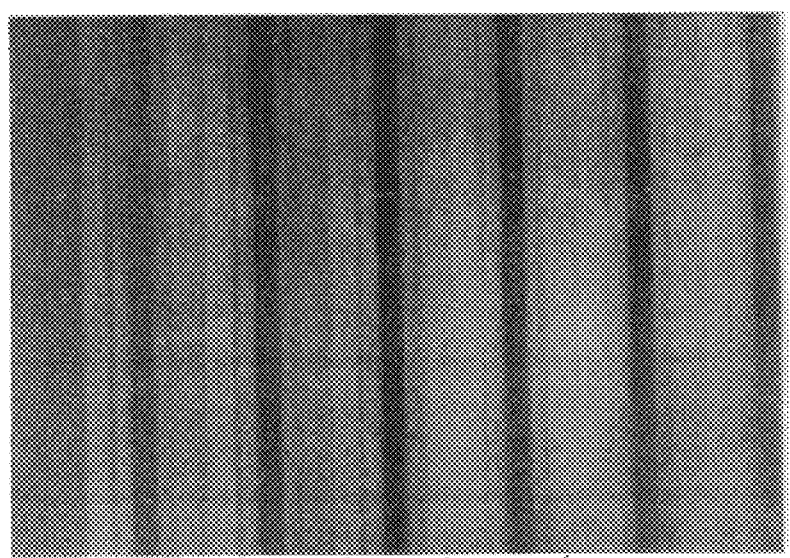
FIG. 4c is a magnified view of FIG. 4b.

FIG. 4a shows double crystal x-ray diffraction (DCXRD) data and dynamical simulation for a 60 Å quantum well strain compensated sample. Composition and thickness data are extracted from the model and are listed in the epitaxial structure of FIG. 3. FIG. 4b, is a cross-sectional transmission electron microscope (TEM) image of the 60 Å quantum well sample. No dislocations are observed. FIG. 4c is a higher magnification of the superlattice region of the detector shown in FIG. 4b. The four constituent materials are labeled in FIG. 4c. For the devices of the present invention, 60 Å is generally the limit for the MQW in $In_{1-x}Ga_xAs$ device wherein x=0.17. With more In content, the limit decreases. Over 60 Å the material starts to relax and does not work well.

Figure 5:
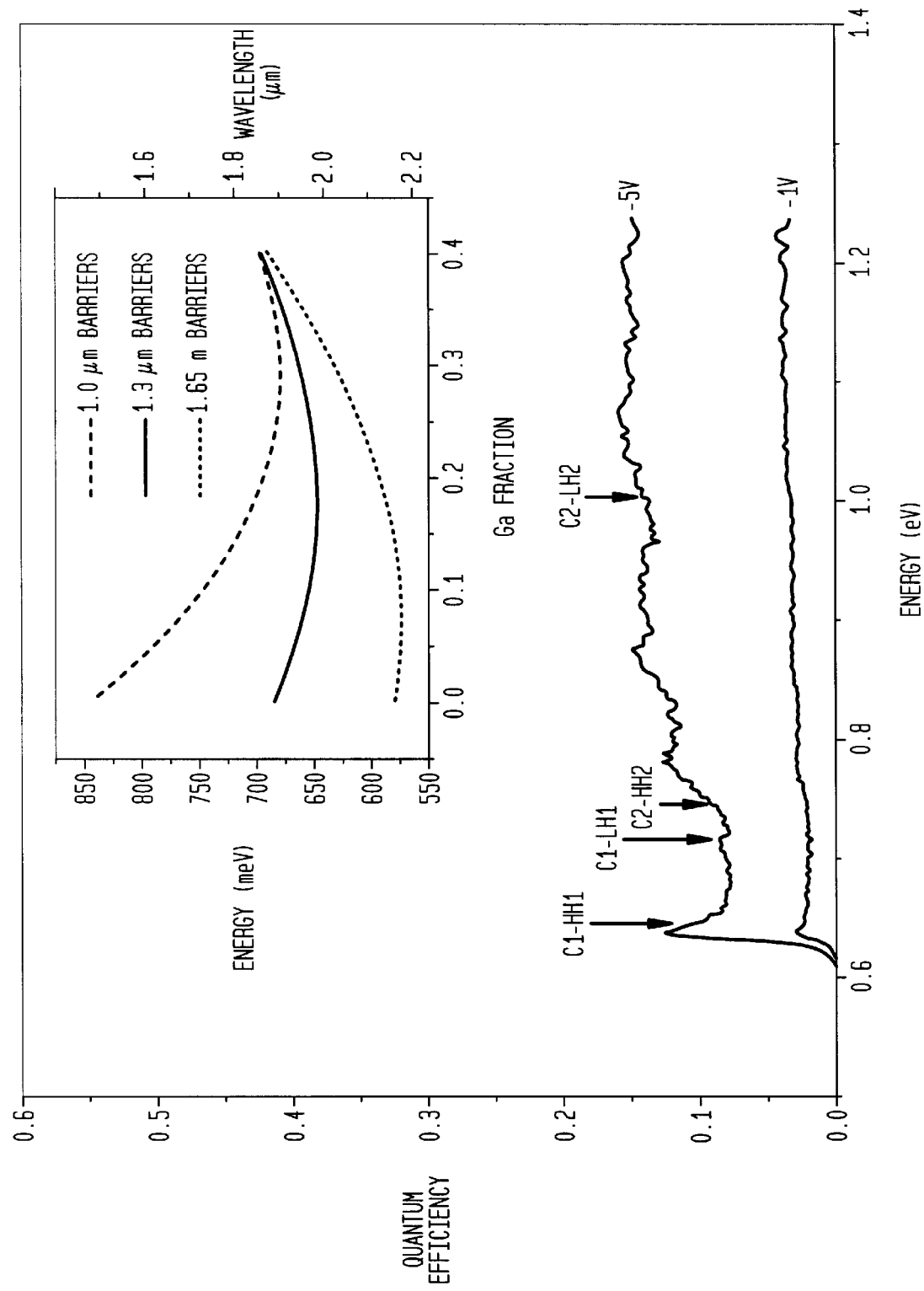
FIG. 5 is a diagram showing the spectral dependence of the quantum efficiency, with an inset showing theoretical calculations of how far the cutoff wavelength can be taken.

FIG. 5 shows the spectral dependence of quantum efficiency. The cutoff wavelength is extended from $\lambda$=1.65 $\mu$m for lattice-matched $In_{0.53}Ga_{0.47}As$ on InP, to $\lambda$=1.95 $\mu$m for the 50 QW detector with 60 Å wells according to the present invention. Several QW transitions are observed by steps and peaks in the spectrum. The inset displays the results of a calculation of the effect of barrier height on the lowest lying energy transition in the QW. The QW width at each Ga fraction was chosen to be the Matthews-Blakeslee critical layer thickness (J. W. Matthews and A. E. Blakeslee, J. Cryst. Growth 27,118 (1974)). As such, the results provide an upper limit on the photodiode cutoff wavelength using the various materials available. This approach is limited however by the need for tensile strain in the barrier layers, and thus the barrier composition must have a Ga fraction greater than 0.47 for strain compensation using InGaAs-InGaAs.

Figure 6:
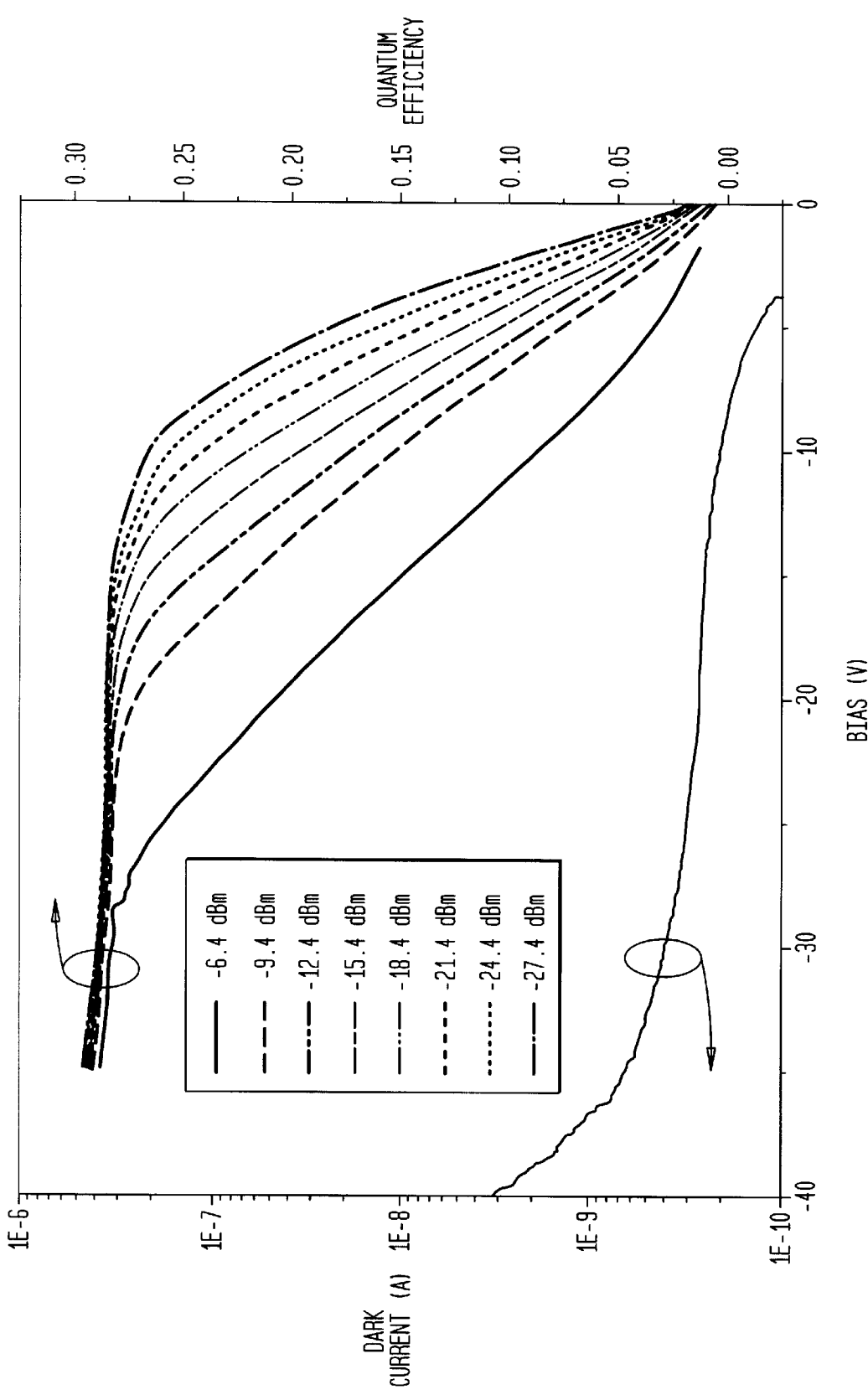
FIG. 6 is a diagram of dark current and quantum efficiency with light intensity as a parameter.

FIG. 6 shows device quantum efficiency, with light intensity as a parameter, and dark current as a function of reverse bias from 0 to 40V for a 75 $\mu$m diameter detector at $\lambda$=1.55 $\mu$m. Quantum efficiency is both bias and intensity dependent due to hole trapping in the valence band of the quantum wells. Here, quantum efficiency is as high as 30% in this single-pass, non-anti-reflection coated configuration. At low to moderate intensities, the trapped holes screen the applied electric field thus necessitating higher fields for efficient carrier extraction. Capacitance data reveal that the superlattice is fully depleted under low intensity illumination of 28 $\mu$W at 0V. Due to the large density of trapped holes under higher illumination, the depletion width only extends through 50% of the superlattice. Under these conditions therefore, higher voltages are necessary to fully deplete the superlattice and extract the traped carriers. From these data, it is believed that a 50 QW device in a substrate-illuminated, anti-reflection coated device with a reflective top contact should achieve quantum efficiency of between 60% and 80%. The dark current of 250 pA at 20V is more than 3 orders of magnitude lower than that of detectors using HgCdTe, InAs, InSb, InGaAs, and GaInAsSb.

The speed of response for the detectors according to the present invention was measured using a 300 $\mu$m diameter mounted device using a $\lambda$=1.55 $\mu$m wavelength laser with a 5 ns response time. The detector rise time is bias dependent, ranging from 100 ns to 25 ns at bias voltages of 1.5V and 10V, respectively, and is limited by thermionic emission over the quantum well barriers. Hole trapping dominates the decay phase of the pulse response with a characteristic lifetime of 330 ns. This is the result of the wide bandgap InP (1.35 eV) and InGaP (1.485 eV) used as QW barriers. Faster pulse response decay times may be obtained by strain compensating with lower bandgap barrier materials such as tensile-strained InGaAs. Hole trapping will thus be minimized and lower voltage operation obtained.

In an effort to understand the observed photocurrent spectra and predict the cutoff wavelengths of various materials combinations, the propagation matrix method (S. L. Chung, *Physics of Optoelectronic Devices,* Wiley, New York, 1995) was used to determine the eigenenergies of the various conduction to heavy and light hole energy transitions in the MQW. The material parameters used in these calculations are the electron and hole effective masses and energy band offsets, assuming parabolic energy bands. The band offsets for all materials are calculated using the model-solid theory of Van de Walle (C. G. Van de Walle, Phys.Rev. B 39, 1871 (1989), which results in values that are consistent with experimental observation. Effects of strain on the band edge energies, as well as heavy and light hole splitting using the phenomenological approach of deformation potentials are included. Heavy and light hole masses are calculated using interpolated Luttinger parameters (S. L. Chuang, *Physics of Optoelectronic Devices,* Wiley, New York, 1995) $\gamma_1$ and $\gamma_2$ via the relation $m_{hh(-)/lh(+)}=1/(\gamma_1 \pm \gamma_2)$. Results for the band edge energy transitions are noted in FIG. 5 by arrows. Excellent agreement is found for the lowest lying energy level, C1-HH1. The agreement is not as good for higher energy transitions due to non-linear strain effects on the band edges, and the effect of band non-parabolicity for states higher in the energy band.

The propagation matrix method is easily extended to study field dependent effects on the bound state energies of the quantum well. At ~5V reverse bias, the average field in the MQW region is ~40 kV/cm given a measured background carrier concentration of $3\times10^{15}$ cm$^{-3}$. When the bound states are solved in this field-modified potential, we predict a 30 meV blue shift from the 1.92 μm calculated cutoff wavelength is predicted, although the spectra do not reveal such a shift. The absence of a Stark shift has previously been seen in InGaAs/InP quantum well detectors (H. Temkin, M. B. Panish and R. A. Logan, Appl. Phys. Lett. 47, 978 (1985)) and was used as a test of the sequential screening theory by Cavicchi (R. E. Cavicchi, D. V. Lang, D. Gershoni, A. M. Sergent, H. Temkin and M. B. Panish, Phys. Rev. B 38, 13474(1988)). It was found that the positive charge in the quantum well distorted the field in the superlattice resulting in no Stark shift over a wide range of bias voltages. When fields >130 kV/cm were applied, the screening effect was eliminated resulting in the predicted Stark shift.

Using the above results, limits of this strain-compensation technique for extending the cutoff wavelength beyond λ=1.95 μm may be predicted. Lowering the height of the potential barrier surrounding the quantum well reduces the bound state energy. Thus, the cutoff wavelength of the detector may be extended by strain-compensation with a narrow bandgap tensile-strained material as shown in the inset of FIG. 5. The figure gives the C1-HH1 transition energies for various values of gallium fraction with barrier bandgap as a parameter. The quantum well thickness is chosen as the corresponding $t_c$ for each gallium fraction. There is a clear minimum in the cutoff wavelength for each barrier material. For slightly mismatched materials, the limiting factor is the relatively wide bandgap of the InGaAs. For highly strained InGaAs, quantum confinement effects become dominant because the quantum well thickness becomes very small, and the bound state energy lies very near the barrier energy. Finally, in order to use strain compensation, a tensile strained material with a bandgap cutoff λ>1.65 μm must be used, because $In_{0.53}Ga_{0.47}As$ is the smallest bandgap material that is lattice-matched to InP. Thus the lower curve in the inset of FIG. 5, with a minimum cutoff wavelength of λ=2.15 μm, represents an upper limit for the cutoff wavelength of strain-compensated InGaAs MQW detectors.

It should be pointed out that the strain compensated method and techniques set forth herein can be used with other material systems as would be known to one skilled in the art.

Having thus described the invention in detail, it is to be understood that the foregoing description is not intended to limit the spirit and scope thereof. What is desired to be protected by Letters Patent is set forth in the appended claims.

What is claimed is:

1. A photoconducting device having a strain compensated absorption region comprising:

at least one strained III–V compound quantum well layer, said layer including $In_{1-x}Ga_x$ as an element thereof, wherein x is selected to achieve a strain >1.5%; and a strained barrier layer corresponding to each said strained quantum well layer wherein said barrier layer strain operates in a manner to substantially offset said strain acting on said quantum well layer.

2. The device of claim 1 wherein said strained quantum well layer is compressively strained and said strained barrier layer is tensile strained.

3. The device of claim 1 wherein said strained quantum well layer is tensile strained and said strained barrier layer is compressively strained.

4. The device of claim 1 wherein said strained barrier layer comprises InGaAs, InGaP or InGaAsP.

5. The device of claim 1 wherein said quantum well layer comprises InGaAs.

6. The device of claim 1 further comprising a transition layer between said strained quantum well layer and said strained barrier layer.

7. The photoconductor of claim 6 wherein the transition layer comprises $In_{1-x}Ga_xAs_yP_{1-y}$ with lattice constant intermediate between that of said strained quantum well layer and said strained barrier layer.

8. The device of claim 1 comprising a plurality of greater than 10 periods of said strained quantum well layers.

9. A method for extending the absorption region of quantum well photoconductors to longer wavelengths comprising the steps of:

depositing a layer of compressively strained $In_{1-x}Ga_xAs$ on a substrate; wherein x is selected to achieve a strain >1.5%, and offsetting said compressive strain by depositing a second layer of material having an equal and opposite tensile strain on said compressively strained layer.

10. The method of claim 9 wherein the second material comprises InGaAs or InGaP, or InGaAsP.

11. The method of claim 9 further comprising adding a lattice matched transition layer between the compressively strained InGaAs and the second layer of material.

12. The method of claim 9 wherein the transition layer comprises $In_{1-x}Ga_aAs_yP_{1-y}$.

13. A photoconducting device having a strain compensated multiple quantum well absorption region comprising at least one compression strained III–V compound quantum well layer, said layer including $In_{1-x}Ga_x$ as an element thereof, wherein x is selected to achieve a strain >1.5%; and a tensile strained barrier layer corresponding to each said strained quantum well layer wherein said barrier layer strain operates in a manner to substantially offset a strain force acting on said quantum well layer.

14. The device of claim 13 wherein x<0.47.

15. The device of claim 14 wherein said quantum well layer comprises strained $In_{1-x}Ga_xAs$.

16. The device of claim 15 wherein the tensile strained barrier layer is comprised of InGaAs, InGaP or InGaAsP.

17. The device of claim 16 wherein a transition layer is positioned between said quantum well layer and said barrier layer.

18. The device of claim 17 wherein the transition layer comprises $In_{1-x}Ga_xAsyP_{1-y}$.

* * * * *